United States Patent [19]

Jang

[11] Patent Number: 5,663,725
[45] Date of Patent: Sep. 2, 1997

[54] VLC DECODER WITH SIGN BIT MASKING

[75] Inventor: Yi-Feng Jang, Keelung, Taiwan

[73] Assignee: Industrial Technology Research Institute, Chutung Hsinchu, Taiwan

[21] Appl. No.: 555,367

[22] Filed: Nov. 8, 1995

[51] Int. Cl.$^6$ .................................................. H03M 7/40
[52] U.S. Cl. ............................................................ 341/67
[58] Field of Search ........................................ 341/65, 67

[56] References Cited

U.S. PATENT DOCUMENTS

| | | | |
|---|---|---|---|
| 4,177,456 | 12/1979 | Fukinuki | 340/347 |
| 4,580,129 | 4/1986 | Bahgat | 341/67 |
| 4,853,696 | 8/1989 | Mukherjee | 341/65 |
| 5,032,838 | 7/1991 | Murayama et al. | 341/67 |
| 5,055,841 | 10/1991 | Cordell | 341/67 |
| 5,166,684 | 11/1992 | Juri et al. | 341/67 |
| 5,225,832 | 7/1993 | Wang et al. | 341/67 |
| 5,245,338 | 9/1993 | Sun | 341/67 |
| 5,280,349 | 1/1994 | Wang et al. | 358/133 |
| 5,363,097 | 11/1994 | Jan | 341/67 |
| 5,479,527 | 12/1995 | Chen | 382/232 |

FOREIGN PATENT DOCUMENTS

| | | | |
|---|---|---|---|
| 262619 | 11/1995 | Taiwan | H03M 7/40 |

*Primary Examiner*—Howard L. Williams
*Attorney, Agent, or Firm*—Meltzer, Lippe, Goldstein, et al.

[57] ABSTRACT

The present invention relates to a parallel variable length decoder and a method for decoding a signed variable length code word. Variable length decoding (VLD) is a widely-used method in data compression, especially, in the applications of image data communication and storage. Many international standards have adopted this technique in video data compression, for example, JPEG, MPEG, CCITT H.261 and so on. Two programmable logic arrays (PLAs) are used in conventional VLD which differ only in there sign. The present invention uses a single PLA which is triggered by bits of signed fixed length inputs, not including a sign bit. The PLA output an unsigned run-level pair. The VLD processes the sign bit outside the PLA. A mask circuit is used to extract the sign bit which is then combined with the decoded unsigned run-level pair to get a signed run-level pair.

10 Claims, 5 Drawing Sheets

FIG. 1
(PRIOR ART)

| NO. | RUN | LEVEL | CODE | NO. | RUN | LEVEL | CODE |
|---|---|---|---|---|---|---|---|
| 1 | EOB | | 10 | 34 | 3 | 4 | 0000 0000 1001 1s |
| 2 | 0 | 1 | 1s (FIRST COEFF-ICIENT IN BLOCK) | 35 | 4 | 1 | 0011 0s |
| | | | | 35 | 4 | 2 | 0000 0011 11s |
| 3 | 0 | 1 | 11s (NOT FIRST COEF-FICIENT IN BLOCK) | 36 | 4 | 3 | 0000 0001 0010 s |
| | | | | 37 | 5 | 1 | 0001 11s |
| 4 | 0 | 2 | 0100 s | 48 | 5 | 2 | 0000 0010 01s |
| 5 | 0 | 3 | 0010 1s | 49 | 6 | 1 | 0001 01s |
| 6 | 0 | 4 | 0000 110s | 40 | 6 | 2 | 0000 0001 1110 s |
| 7 | 0 | 5 | 0010 0110 s | 41 | 7 | 1 | 0001 00s |
| 8 | 0 | 6 | 0010 0001 s | 42 | 7 | 2 | 0000 0001 0101 s |
| 9 | 0 | 7 | 0000 0010 10s | 43 | 8 | 1 | 0000 111s |
| 10 | 0 | 8 | 0000 0001 1101 s | 44 | 8 | 2 | 0000 0001 0001 s |
| 11 | 0 | 9 | 0000 0001 1000 s | 45 | 9 | 1 | 0000 101s |
| 12 | 0 | 10 | 0000 0001 0011 s | 46 | 9 | 2 | 0000 0000 1000 1s |
| 13 | 0 | 11 | 0000 0001 0000 s | 47 | 10 | 1 | 0010 0111 s |
| 14 | 0 | 12 | 0000 0000 1101 0s | 58 | 10 | 2 | 0000 0000 1000 0s |
| 15 | 0 | 13 | 0000 0000 1100 1s | 59 | 11 | 1 | 0010 0011 s |
| 16 | 0 | 14 | 0000 0000 1100 0s | 50 | 12 | 1 | 0010 0010 s |
| 17 | 0 | 15 | 0000 0000 1011 1s | 51 | 13 | 1 | 0010 0000 s |
| 18 | 1 | 1 | 011s | 52 | 14 | 1 | 0000 0011 10s |
| 19 | 1 | 2 | 0001 10s | 53 | 15 | 1 | 0000 0011 01s |
| 20 | 1 | 3 | 0010 0101 s | 54 | 16 | 1 | 0000 0011 00s |
| 21 | 1 | 4 | 0000 0011 00s | 55 | 17 | 1 | 0000 0001 1111 s |
| 22 | 1 | 5 | 0000 0001 1011 s | 56 | 18 | 1 | 0000 0001 1010 s |
| 23 | 1 | 6 | 0000 0000 1011 0s | 57 | 19 | 1 | 0000 0001 1001 s |
| 24 | 1 | 7 | 0000 0000 1010 1s | 68 | 20 | 1 | 0000 0001 0111 s |
| 25 | 2 | 1 | 0101 s | 69 | 21 | 1 | 0000 0001 0110 s |
| 26 | 2 | 2 | 0000 100s | 60 | 22 | 1 | 0000 0000 1111 1s |
| 27 | 2 | 3 | 0000 0010 11s | 61 | 23 | 1 | 0000 0000 1111 0s |
| 28 | 2 | 4 | 0000 0001 0100 s | 62 | 24 | 1 | 0000 0000 1110 1s |
| 29 | 2 | 5 | 0000 0000 1010 0s | 63 | 25 | 1 | 0000 0000 1110 0s |
| 30 | 3 | 1 | 0011 1s | 64 | 26 | 1 | 0000 0000 1101 1s |
| 31 | 3 | 2 | 0010 0100 s | 65 | ESCAPE | | 0000 01 |
| 32 | 3 | 3 | 0000 0001 1100 s | | | | |

FIG. 2
(PRIOR ART)

| NO. | LENGTH | CODE-WORD | NO. | LEVEL | CODE |
|---|---|---|---|---|---|
| 1 | 2 | 10 | 34 | 14 | 0000 0000 1001 1s |
| 2 | 2 | 1s | 35 | 6 | 0011 0s |
|  |  |  | 35 | 11 | 0000 0011 11s |
| 3 | 3 | 11s | 36 | 13 | 0000 0001 0010 s |
|  |  |  | 37 | 7 | 0001 11s |
| 4 | 5 | 0100 s | 48 | 11 | 0000 0010 01s |
| 5 | 6 | 0010 1s | 49 | 7 | 0001 01s |
| 6 | 8 | 0000 110s | 40 | 13 | 0000 0001 1110 s |
| 7 | 9 | 0010 0110 s | 41 | 7 | 0001 00s |
| 8 | 9 | 0010 0001 s | 42 | 13 | 0000 0001 0101 s |
| 9 | 11 | 0000 0010 10s | 43 | 8 | 0000 111s |
| 10 | 13 | 0000 0001 1101 s | 44 | 13 | 0000 0001 0001 s |
| 11 | 13 | 0000 0001 1000 s | 45 | 8 | 0000 101s |
| 12 | 13 | 0000 0001 0011 s | 46 | 14 | 0000 0000 1000 1s |
| 13 | 13 | 0000 0001 0000 s | 47 | 9 | 0010 0111 s |
| 14 | 14 | 0000 0000 1101 0s | 58 | 14 | 0000 0000 1000 0s |
| 15 | 14 | 0000 0000 1100 1s | 59 | 9 | 0010 0011 s |
| 16 | 14 | 0000 0000 1100 0s | 50 | 9 | 0010 0010 s |
| 17 | 14 | 0000 0000 1011 1s | 51 | 9 | 0010 0000 s |
| 18 | 4 | 011s | 52 | 11 | 0000 0011 10s |
| 19 | 7 | 0001 10s | 53 | 11 | 0000 0011 01s |
| 20 | 9 | 0010 0101 s | 54 | 11 | 0000 0011 00s |
| 21 | 11 | 0000 0011 00s | 55 | 13 | 0000 0001 1111 s |
| 22 | 13 | 0000 0001 1011 s | 56 | 13 | 0000 0001 1010 s |
| 23 | 14 | 0000 0000 1011 0s | 57 | 13 | 0000 0001 1001 s |
| 24 | 14 | 0000 0000 1010 1s | 68 | 13 | 0000 0001 0111 s |
| 25 | 5 | 0101 s | 69 | 13 | 0000 0001 0110 s |
| 26 | 8 | 0000 100s | 60 | 14 | 0000 0000 1111 1s |
| 27 | 11 | 0000 0010 11s | 61 | 14 | 0000 0000 1111 0s |
| 28 | 13 | 0000 0001 0100 s | 62 | 14 | 0000 0000 1110 1s |
| 29 | 14 | 0000 0000 1010 0s | 63 | 14 | 0000 0000 1110 0s |
| 30 | 6 | 0011 1s | 64 | 14 | 0000 0000 1101 1s |
| 31 | 9 | 0010 0100 s | 65 | 6 | 0000 01 |
| 32 | 13 | 0000 0001 1100 s |  |  |  |

VLC DECODER WITH SIGN BIT MASKING

RELATED APPLICATIONS

The following patent applications are assigned to the assignee hereof and contain subject matter related to the subject matter of the present patent application:

1. U.S. patent application Ser. No. 07/836,062, entitled "HDTV Decoder", filed on Feb. 13, 1992, for Jinn-Shyan WANG and Yung-Jung JAN, now U.S. Pat. No. 5,280,349;
2. U.S. patent application Ser. No. 07/836,076, entitled "High Speed Variable Length Decoder", filed on Feb. 13, 1992, for Jinn-Shyan WANG, Hsin CHU and Yung-Jung JAN, now U.S. Pat. No. 5,225,832;
3. U.S. patent application Ser. No. 08/163,872, entitled "Variable Length Coding System", filed on Dec. 8, 1993, for Yueh-Chang CHEN, now U.S. Pat. No. 5,479,527; and
4. U.S. patent application Ser. No. 08/437,011, entitled "Variable Length Coding With Three-Field Codes", filed on May 8, 1995, for Hsun-Chang HSIEH. The contents of the above-listed issued patents and patent applications are incorporated herein by reference.

FIELD OF THE INVENTION

The present invention relates to a method and apparatus for decoding variable length code words. The invention is especially useful in parallel VLD (Variable Length Decoder) architectures.

BACKGROUND OF THE INVENTION

In variable length coding (VLC), source symbols of a fixed length are encoded as codes having a variable length. Variable length coding is a widely used technique for lossless data compression. For instance, VLC is used in the Motion Pictures Expert Group (MPEG), Joint Photographics Expert Group (JPEG), CCITT H.261 and H.262 standards. Variable length coding (VLC) technique is used to encode frequently occurring fixed length source symbols with shorter codes and infrequently occurring fixed length source symbols with longer codes. In general, the length of the code for a fixed length source symbol is designed to be inversely proportional to the probability of the occurrence of the symbol. Thus, the VLC takes advantage of a non-uniform distribution in the occurrence of the fixed length source symbols. The most wellknown example of a variable length code is the Huffman code.

Variable length code words (VLCWs) may be produced by a serial encoder or a parallel encoder. A serial encoder outputs one bit at a time. A parallel encoder outputs a group of bits (e.g., a group 8 bits ) at a time, in parallel. Conventional VLC techniques are disclosed in M. Stroppiana, L. Ronchetti, Device for reducing the redundancy in blocks of digital video data in DCT encoding U.S. Pat. No. 5,006,930, 1991.4.9., F. Azadegan, E. Fisch, Method and apparatus for digitally processing a high definition television augmentation signal U.S. Pat. No. 5,128,758, 1992.7.7., S. M. Lei, M. T. Sun, An Entropy Coding System for Digital HDTV Application, IEEE Trans. on Circuit and system for Video tech., vol. CASV-1, no. 1, pp. 147–155, February 1991, F. Azadegan, Method and apparatus for digitally processing a high definition television augmentation signal, U.S. Pat. No. 5,179,442, 1993.1.1 2., G. J. Kustka, Variable length decoder, U.S. Pat. No. 5,226,082, 1993.7.6., K. C. Chu, etc., Variable length decoding using lookup tables, U.S. Pat. No. 5,253,053, 1993.10.12., H. Brusewitz, Method and means for variable length coding, U.S. Pat. No. 4,922,510, 1990.5.1., F. Mikami, Variable-length coding/decoding device, U.S. Pat. No. 4,985,700, 1991.1.1 5., N. Shirota Coding and decoding apparatus of variable length data U.S. Pat. No. 5,162,795, 1992.11.10., which are incorporated herein by reference.

According to the MPEG and JPEG standards, the variable length codes are used to encode a pair of values, referred to as a run-level pair. The run-level pair represents a variable length sequence of values including a last value having an amplitude equal to the level of the run-level pair. The sequence also includes a subsequence or "run" of zero or more values having an amplitude of zero. The number of zeros in the "run" is equal to the "run" value of the run-level pair. For example, in the MPEG standard, the sequence 380005001 is represented as (0,38)(3,5)(2,1), where the run-level pair (0,38) indicates that there are no zeros before the number 38, the run-level pair (3,5) indicates that there are 3 zeros before the number 5; and the run-level pair (2,1) indicates that there are 2 zeros before the number 1.

FIG. 1 provides a variable length code table for the CCITT recommendation H.261. The table encodes each of 127 fixed length code words as a corresponding unique VLCW. Each fixed length code word is a pair of a run and a level. The level may be a positive or a negative value. The variable length code associated with each fixed length code word has a sign bit "s" for indicating whether the level has a positive polarity (i.e., s=0) or a negative polarity (i.e., s=1).

FIG. 2 is a variable length decoding table for decoding each variable length code word into a run-level pair. As shown, the variable length decoding table also produces a length value in decoding each VLCW. The purpose of the length value is discussed below.

FIG. 3 shows a conventional parallel variable length parallel encoder 100. The conventional variable length parallel encoder 100 is used for encoding fixed length code words, such as run-level pairs, into variable length code words that are, for example, from 2 bits to 17 bits long. The encoder 100 illustratively includes a PLA (Programmable Logic Array) 110 that stores a code word table 120 and a code length table 130. The PLA 110 receives the fixed length run-level pairs of n bits on line 140.

In response to each run-level pair, the code word table 120 outputs the corresponding variable length code word (VLCW). The code length table 130 outputs a length which equals the number of bits in the VLCW produced by the code word table 120. The VLCW and the length are provided to a circuit 150 on line 160 and 170, respectively. The circuit 150 contains a barrel shifter, registers and a code-length accumulation circuit. The circuit 150 concatenates the VLCWs and arranges the concatenated VLCWs in groups (e.g., byte sized groups) for transmission on line 180.

It should be noted that the VLCWs are chosen so that no shorter code comprises a subset of the bits in a longer code. For this reason, a decoder cannot "mistakenly" recognize and decode a shorter code when it is supposed to receive a longer code. Thus, it is not necessary to explicitly transmit the code length information with each VLCW. Rather, the length value is used by the circuitry 150 of the encoder 100 to concatenate the VLCW together to form one continuous sequence of bits. The bits of the sequence may be stored in a register for later transmission on line 180 to a variable length decoder (VLD).

FIG. 4 shows a variable length decoder (VLD) 200 which was proposed in J. W. Peake, "Decompaction," IBM Technical Disclosure Bulletin vol. 26, no. 9, p. 4794–97, February, 1984. An inputted bitstream to be decoded is formed from the concatenation of VLCWS outputted from the VLC 100 (FIG. 3). P number of bits of the bitstream are received in parallel, on lines 210, in two latches L1 and L2, so that a total of 2P consecutive bits may be stored in the latches L1 and L2. Here, P=the length of the longest variable length code word (VLCW), e.g., 17 bits.

A barrel shifter 230 outputs a P bit "window" i.e., a P bit subsequence, of the 2P consecutive bits stored in the latches L1 and L2. The bits of the next VLCW to be decoded are aligned with the most significant bit of the P bit window. For instance, assume the bits in the received bit stream are $f_y...f_2 sg_w...g_2 s...$, where:

$f_y...f_2 s$ is the first variable length code word having $f_y$ as its most significant bit and s, the sign bit, as its least significant bit; and $g_w...g_2 s$ is the second variable length code word having $g_w$ as its most significant bit and s, the sign bit, as its least significant bit.

A typical P bit window includes, in most significant bit order to least significant bit order, the bit order $f_y...f_2 sg_w...g_{y-z}$, where P=y+z−1. The window of P bits is received in parallel at a pair of PLAs 240, 250. The PLA 240 decodes only the bits of the very next VLCW, i.e., $f_y...f_2 s$, and outputs the decoded run-level pair corresponding thereto. Note that only one VLCW can be decoded from the P bit window (assuming the most-significant bit of the P-bit window is justified with the very next undecoded bit) since no VLCW can be formed by concatenating two other (shorter) VLCWs.

Note that there is no prior knowledge of the length of each VLCW in the bitstream received on line 210. It is necessary to determine which subsequence of the P-bit window formed the most recently decoded VLCW, so that those bits can be removed to align the very next undecoded VLCW with the most significant bit of the P-bit window. To that end, an additional PLA 255 is provided for decoding each VLCW into the respective length (number of bits) of the VLCW. The decoded length is fed back to the barrel shifter 230 which shifts out the bits of the last decoded VLCW. Effectively, the barrel shifter 230 discards the bits of the most recently decoded VLCW and obtains a P-bit window of the P very next consecutive undecoded bits with the most significant bit of the window aligned with the very next undecoded bit.

The decoded run-level pair is outputted to a run length decoder (RLD) 290 which reproduces the original sequence, namely, the level followed by a sequence of zeros (the number of which is specified by the run value).

Inspection of the VLD decoding tables used in JPEG, MPEG I and MPEG II, reveals that the PLA decoding table contains 114 variable length code words the longest of which has a length of 17 bits. The least significant bit (represented by s) of each of the 114 variable length codes indicates whether the variable length code is a positive or a negative number. If s is 0, the decoded level of the variable length code is a positive number. If s is 1, the decoded level is a negative number.

Typically, a VLD does not know in advance if a particular code, to be decoded next, is positive or negative. To cope with this problem, the conventional VLD design uses two variable length decoding tables 240, 250; one variable length decoding table 240 for positive levels where "s", the sign bits are zero (i.e., s=0), and another variable length decoding table 250 for negative levels where s=1. Both PLA tables 240, 250 receive the variable length code words from the barrel shifter 230.

As shown in FIG. 4, if the sign bit s is 0, then the positive variable length decoding table 240 is used. If the sign bit s is 1, then the negative variable length decoding table 250 is used. A multiplexer 260 may be provided for selecting the output of the appropriate table 240 or 250. Depending on the sign bit s, the output 270 of the variable length decoding table 240 (for s=0), or the output 275 of the variable length decoding table 250 (for s=1) is selected by the multiplexer 260. The multiplexer 260 outputs one of the variable length decoding table outputs 270, 275 on line 280 to the RLD 290.

Alternatively, instead of using two variable length decoding tables 240, 250 and the multiplexer 260, only one decoding table may be used that has a storage area which equals the storage area of the two variable length decoding tables 240, 250 combined.

The parallel VLD 200 requires two variable length decoding tables 240, 250, (or one large variable length decoding table having a size which equals the size of the two tables 240, 250 combined) for decoding both positive and negative VLCWs. This necessitates a large memory area requirement which consumes valuable real estate, prevents compactness, increases cost and reduces the decoding speed.

Accordingly, it is an object of the present invention to reduce the size of the VLD decoding table. Another object of the present invention is to reduce the area or storage requirements of the PLA or ROM (Read Only Memory) and increase the decoding speed.

SUMMARY OF THE INVENTION

This and other objects are achieved by the present invention. According to one embodiment of the invention, a method for decoding an original signed variable length code word includes the step of inputting a fixed length sequence of bits, comprising each bit of a first signed variable length code word, including a sign bit of the original signed variable length code word, to a variable length table.

The bits of the first signed variable length code word, other than the sign bit, are decoded into at least an unsigned level and a total length of the signed variable length code word including the signed bit. The sign bit is determined from the decoded length outputted from the variable length table and the original signed variable length code word.

In another illustrative embodiment of the invention, a parallel variable length decoder comprises a barrel shifter, a memory unit and a mask circuit. The barrel shifter receives the original signed variable length code words and outputs a fixed length sequence of bits, comprising each bit of a signed variable length code word including a sign bit of the original signed variable length code word.

The memory unit, which may be a PLA or a ROM, receives the signed variable length code word and decodes only the bits of the signed variable length code word, other than the sign bit, into at least an unsigned level and a total length of the original signed variable length code word including the signed bit.

The mask circuit receives the signed variable length code word from the barrel shifter and the total length from the memory unit and outputs a sign bit of the decoded unsigned level.

Illustratively, the mask circuit has P number of 2-input AND gates and one P-input OR gate, where P equals the length of the longest variable length code word received and also equals the length of the fixed length sequence of bits outputted by the barrel shifter (i.e., the barrel shifter's window is P bits long). The AND gates receive the fixed length sequence of bits from the barrel shifter and the decoded total length (length-out signal) outputted from the memory unit. The AND gates mask out each bit of the fixed length sequence of bits except the sign bit of the decoded signed VLCW. The OR gate logically ORs all of the masked bits outputted from the AND gates to produce the sign bit.

BRIEF DESCRIPTION OF THE INVENTION

FIG 1 is table which associates a variable length code word with each of a plurality of fixed length code words;

FIG. 2 is a variable length decoding table for decoding variable length code words into a run-level pair;

DETAILED DESCRIPTION OF THE INVENTION

The present invention discloses a novel VLD that has a memory unit which is smaller in size than in conventional VLDs. Illustratively, the memory unit is a PLA, ROM or other suitable memory. For the sake of convenience, the description of the present invention will focus on the use of a PLA. The invention, however, is equally applicable to a ROM architecture or other types of memories.

Figure 5:
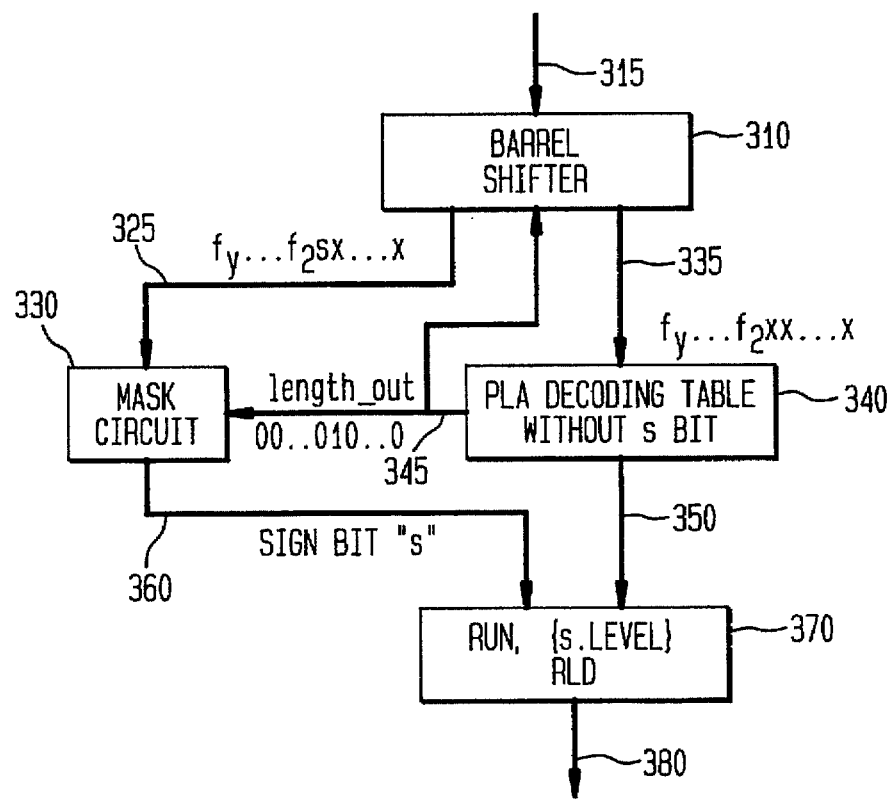
FIG. 5 is a block diagram of a parallel decoder which reconstructs a variable length code using a mask circuit and a single polarity VLD, according to an embodiment of the invention.

FIG. 5 schematically illustrates a parallel VLD (Variable Length Decoder) 300. The VLD 300 comprises a barrel shifter 310 which receives incoming compressed data on line 315. The incoming compressed data includes variable length codewords which are concatenated together. The barrel shifter 310 outputs a P bit window $f_y...f_2sg_w...g_{y-z}$, on line 325 to a mask circuit 330. The barrel shifter 310 also outputs the P bit window $f_y...f_2sg_w...g_{y-z}$ on line 335 to a VLD decoding table 340. Illustratively, P is 17 bits.

According to one embodiment, the VLD decoding table 340 does not distinguish between the positive and negative versions of each VLCW. That is, the VLD decoding table 340 is triggered by the subsequence of bits of each VLCW that does not include its least significant bit, the sign bit. Therefore, upon receipt of the P bit window $f_y...f_2sg_w...g_{y-z}$ by the VLD decoding table 340, the bits $f_y...f_2$ of the first VLCW are decoded on the first cycle. The remaining bits, i.e., $sg_w...g_{y-z}$ are ignored in the first cycle. For the sake of convenience, the ignored bits of the VLCW P bit window $f_y...f_2sg_w...g_{y-z}$ are shown as "x" in FIGS. 5 and 7, since they are not used in the first cycle.

After the bits $f_y...f_2$ trigger the PLA 340, a length-out signal 345 is outputted from the VLD table to the mask circuit 330. The length-out signal 345 is also fed back to the barrel shifter 310. The barrel shifter 310 uses the length-out signal 345 to shifts its P bit long window so that the window is aligned with the most significant bit of the next VLCW, i.e., aligned with $g_w$. Note the length-out signal 345 denotes the length of the VLCW just decoded including its sign bit s. Furthermore, the length-out signal 345 is P bits long.

Illustratively, the length-out signal 345 is a sequence of bits which are all zeros except for one bit, which is aligned with the location of the sign bit (i.e., the least significant bit) of the VLCW just decoded. In the above example, the sequence is y−1 "zeros" followed by "one", followed by z+1 "zeros".

Figure 3:
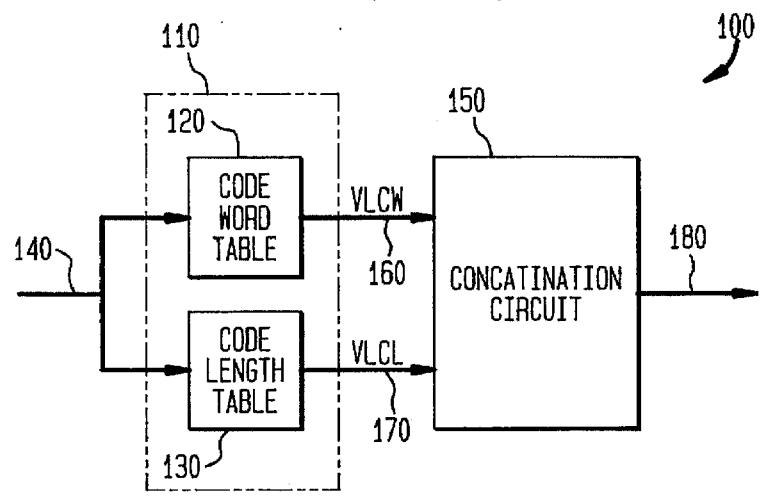
FIG. 3 is a conventional parallel encoder.
Figure 4:
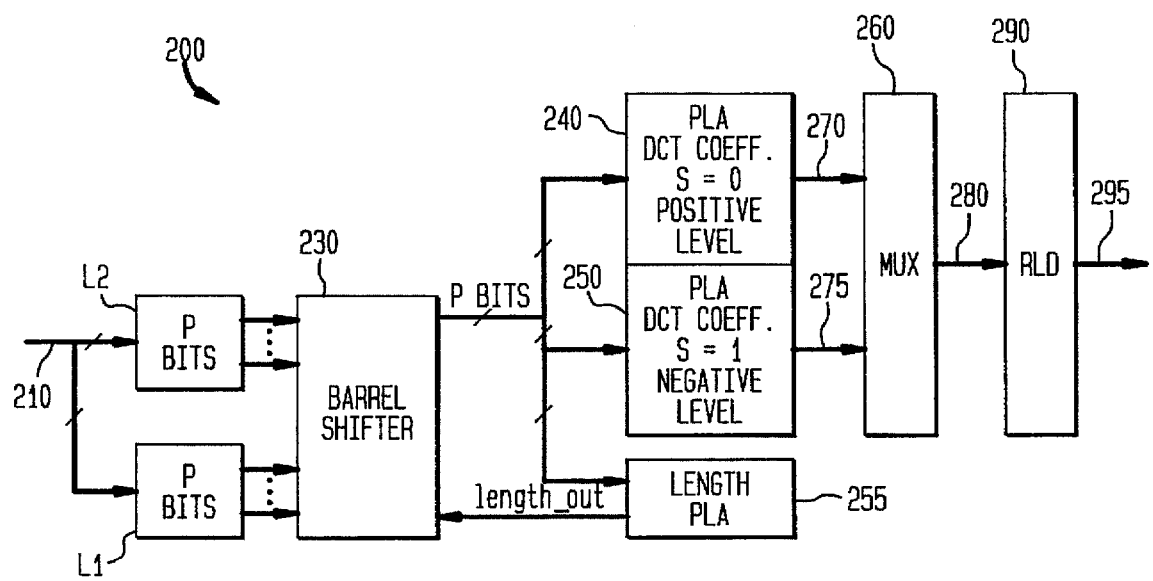
FIG. 4 is a block diagram of a conventional parallel decoder which reconstructs a variable length code using a first VLD table for positive VLCWs and a second VLD table for negative VLCWs.

In comparison with the conventional VLD 200 shown in FIG. 4, instead of using two VLD tables, (positive and negative VLD tables 240, 250 of FIG. 4,) the inventive VLD 300 uses a single VLD table 340 that does not have the sign bit s. This reduces the area or the number of coefficients in the VLD table 340 by on half.

The decoded output from the PLA 340 on line 350 is always the absolute value of the level. Thus, it is necessary to determine the polarity, i.e., the sign of the decoded level. This is achieved outside of PLA 340, using the mask circuit 330 as explained below.

From the P bit window $f_y...f_2sg_w...g_{y-z}$ received on line 325 and the length-out signal 345, the mask circuit 330 determines the sign bit s and outputs the determined sign bit on line 360. The positive decoded output from the PLA 340 on line 350 and the sign bit s on line 360 (from the mask circuit 330) are inputted to a run length decoder (RLD) 370. The RLD 370 outputs a reconstructed data on line 380. The reconstructed data is the originally encoded sequence of values, namely, the level as determined from the sign bit s on line 360, proceeded by a run of zeros (the number of which is specified by the decoded run value received on line 350).

Figure 6:
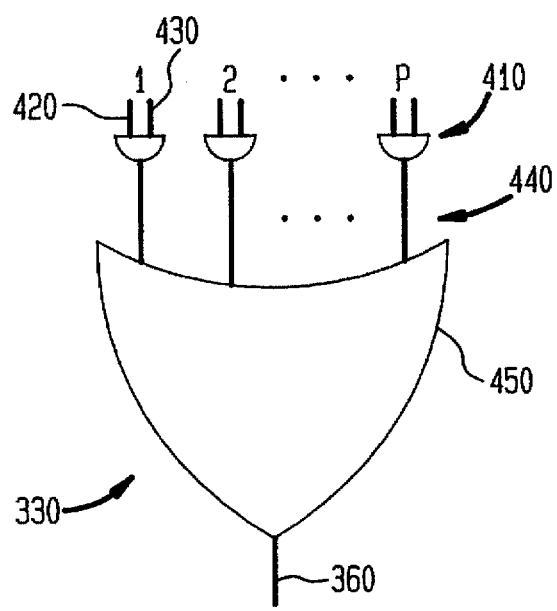
FIG. 6 is a block diagram of the mask circuit shown in FIG. 5 according to an embodiment of the invention.

FIG. 6 shows the mask circuit 330 in greater detail. The mask circuit 330 comprises P number of 2-input AND gates 410. Each AND gate receives as a first input a respective bit of the P bit window $f_y...f_2sg_w...g_{y-z}$ outputted from the barrel shifter 310 on line 325. The other input 430 is the length-out signal 345 from the PLA 340. Using the length-out signal 345, the mask circuit 330 extracts the sign bit s as follows.

The length-out signal 345 has P−1 bits having a value of "zero" and one bit having a value of "one". The "zero" valued bits of the length-out signal 345, at the AND gate inputs 430, when ANDed with the respective bits of the P bit window $f_y...f_2sg_w...g_{y-z}$, at the AND gate inputs 420, will produce zeros at the respective outputs 440 of the AND gate 410. The single "one" valued bit of the length-out signal 345 is aligned with the location of the sign bit (i.e., at the location of the least significant bit of the VLCW just decoded) in the P bit window $f_y...f_2sg_w...g_{y-z}$. The AND gates 410 mask out every bit of the P bit window $f_y...f_2sg_w...g_{y-z}$ except the "s" bit. Thus, the AND gates 410 produce all zeros except the sign bit "s".

Figure 7:
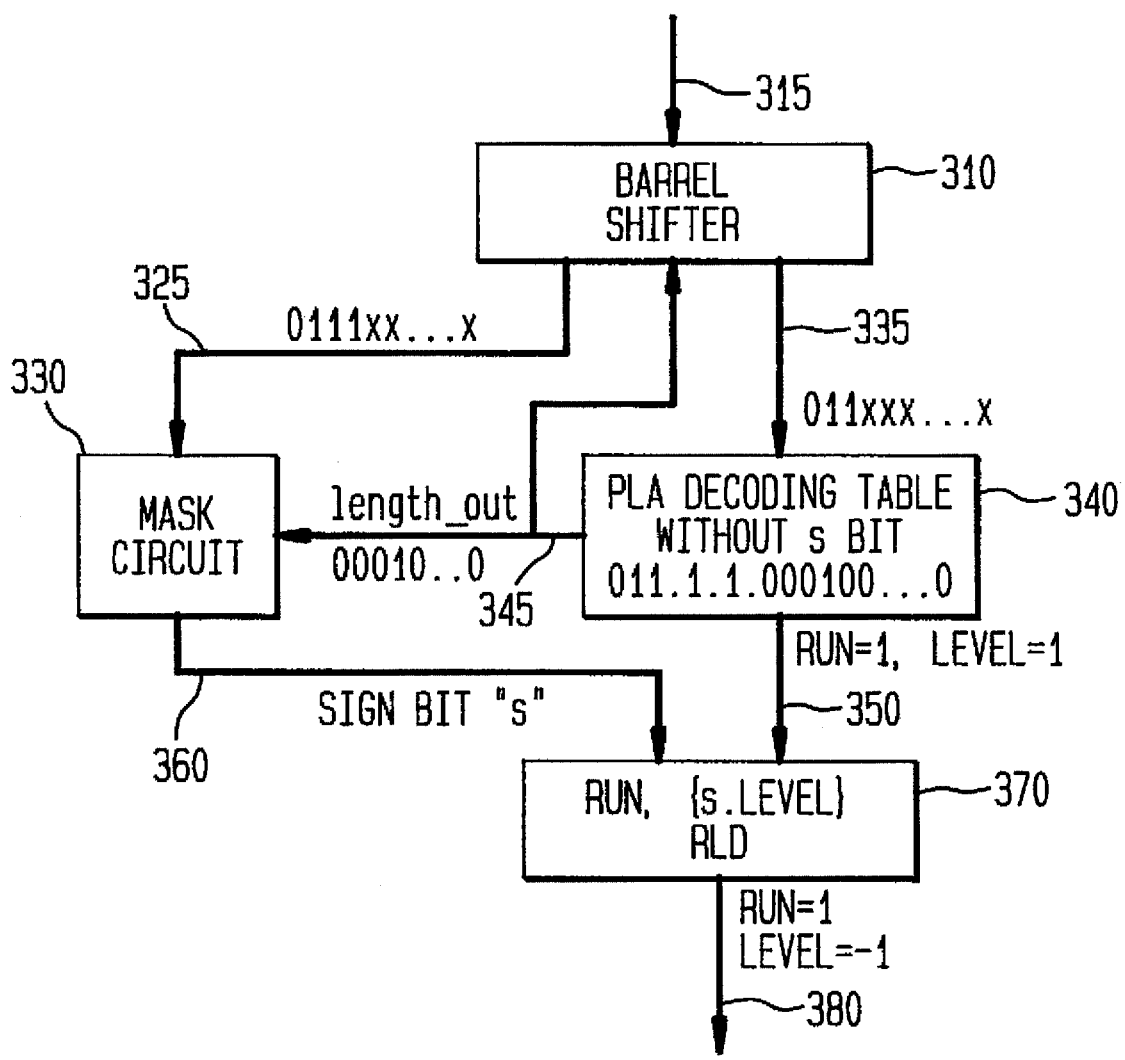
FIG. 7 is a block diagram of the parallel decoder shown in FIG. 5 processing an illustrative variable length code word according to an embodiment of the invention

All the outputs 440 of the AND gate are zero except for one output, which is the sign bit s. These zero bits and the sign bit s are inputted into a single OR gate 450 having P number of inputs which are connected to the P number of outputs 440 of the AND gate 410. Because one of the inputs of the OR gate 440 is the sign bit s and the rest are zero, the output 360 (also shown in FIG. 7) of the OR gate 440 is the sign bit s. As shown in FIG. 7, the output 360 of the mask circuit 330 is one of the inputs to the RLD 370.

The operation of the VLD 300 will now be described using FIG. 7. Suppose the next VLCW to be decoded in the P bit window $f_y...f_2sg_w...g_{y-z}$ outputted from the barrel shifter 310 is 0111, wherein, the least significant bit (the sign bit s) is equal to "1". The barrel shifter 310 outputs the P bit window 0111xx..x into the mask circuit 330, where "x" are the remaining bits of P bit grouped VLCWs which are not decoded in the present cycle.

The barrel shifter also 310 also outputs the P bit window 0111xx..x 325 into the mask circuit 330. The PLA 340, which only decodes the bits of the VLCWs other than the sign bit, is triggered by the first three bits 011 received (on line 335) from the barrel shifter 310.

The PLA decodes the VLCW 011 and outputs its corresponding run, e.g., run=1 and an unsigned level, i.e. absolute value of level=1. The PLA also outputs the length-out signal 345 to the mask circuit 330 and to the barrel shifter 310. Illustratively, the length-out signal 345 corresponds to the total length of the variable length code word 0111, including the sign bit. Thus, the length-out signal 345 indicates a length of 4, i.e., the length-out signal 345 is 000100 ... 0.

The mask circuit 330 masks the P bit window 0111 x...x with the length-out signal 345 000100...0 received from the PLA 340. From the P bit window 0111 xx..x on line 325 and the length-out signal 345, the mask circuit 330 masks out each bit other than the 4th bit of the P bit window 0111x...x (i.e., the least significant bit, which is the sign bit s). The masked signal thus produced, i.e., the s bit where s=1, is outputted on line 360 to the RLD 370. The RLD 370 combines the s=1 received from the mask circuit 330 (on line 360), with the level=1 received from the VLD decoding table 340 (on line 350). Because the sign bit s is 1, the level is −1. The RLD outputs on line 380 the sequence 0,−1.

On the other hand, if the variable length code is 0110, then the masked result from the mask circuit 330 will be equal to 0 and the level will be 1. The outputted sequence is thus 0,−1.

Unlike the conventional VLD design, which uses separate VLD tables for positive and negative polarities of each VLCW, in the present invention, the VLD table decodes, the positive and negative polarities of each VLCW the same way, i.e., into an absolute value of the fixed length code word. This reduces the storage requirement of the variable length decoding table by half. In addition, the variable length decoding table, according to the invention, decodes slightly shorter VLCWs, i.e., which are one bit shorter by virtue of not decoding the sign bit.

In short, a new variable length decoding apparatus and technique are disclosed. The inventive VLD uses a single VLD table which is triggered by the VLCW other than the sign bit. Thus, the area of the memory unit of the inventive VLD is reduced by more than half as compared to conventional VLDs. This increases speed of decoding and reduces the implementation cost of a parallel variable length decoder.

Finally, the above-described embodiments of the invention are intended to be illustrative only. Numerous alternative embodiments may be devised by those skilled in the art without departing from the scope of the following claims.

I claim:

1. A parallel variable length decoder for decoding original signed variable length code words comprising:

a barrel shifter which receives said original signed variable length code words and outputs a fixed length sequence of bits, comprising each bit of a signed variable length code word including a sign bit of said original signed variable length code word, a memory unit which receives said signed variable length code word and decodes only said bits of said signed variable length code word, other than said sign bit, into at least an unsigned level and a total length of said original signed variable length code word including said sign bit, and a mask circuit which receives said signed variable length code word from said barrel shifter and said total length from said memory unit and outputs a sign bit of unsigned level.

2. The parallel variable length decoder of claim 1 further comprising a run length decoder which receives said sign bit from said mask circuit and said unsigned level from said memory unit and outputs a signed level.

3. The parallel variable length decoder of claim 1, wherein said sign bit is combined with the unsigned level decoded from the decoding table of the memory unit.

4. The parallel variable length decoder of claim 1, wherein said memory unit is a programmable logic array.

5. The parallel variable length decoder of claim 1, wherein said memory unit is a read only memory.

6. The parallel variable length decoder of claim 1, wherein said mask circuit comprises:

P number of 2-input AND gates having P number of outputs, and a P-input OR gate which receives said P number of outputs and outputs said sign bit, wherein P represents the longest of said unsigned data in the decoding table, wherein P equal equals the number of bits in said fixed length sequence of bits ouptutted from said barrel shifter.

7. A method for decoding an original signed variable length code word comprising the steps of:

inputting a fixed length sequence of bits, comprising each bit of a first signed variable length code word including a sign bit of said original signed variable length code word to a variable length table, decoding only said bits of said first signed variable length code word, other than said sign bit, into at least an unsigned level and a total length of said original signed variable length code word including said sign bit, and determining a polarity of said unsigned level from said decoded total length and said bits of said original signed variable length code word including said sign bit.

8. The method of claim 7 further comprising, before the inputting step, the step of inputting signed variable length code word to a barrel shifter.

9. The method of claim 7 further comprising, after the determining step, the step of combining said sign bit with said unsigned level.

10. The method of claim 7 wherein the determining step comprises the steps of:

inputting each bit of said signed variable length code word including said sign bit of said signed variable length code word to a mask circuit, outputting from said variable length table said decoded total length, receiving said decoded total length by said mask circuit, and extracting by said mask circuit said sign bit.

* * * * *